United States Patent [19]

Oaks

[11] Patent Number: 4,808,911

[45] Date of Patent: Feb. 28, 1989

[54] LOOP RESISTANCE TEST APPARATUS

[75] Inventor: Richard W. Oaks, Tucson, Ariz.

[73] Assignee: Hughes Aircraft Company, Los Angeles, Calif.

[21] Appl. No.: 76,528

[22] Filed: Jul. 22, 1987

[51] Int. Cl.$^4$ .............................................. G01R 27/02
[52] U.S. Cl. ................................... 324/57 Q; 324/62; 324/445
[58] Field of Search .............. 324/62, 64, 65 R, 57 Q, 324/127, 445

[56] References Cited

U.S. PATENT DOCUMENTS

| | | | |
|---|---|---|---|
| 3,867,688 | 2/1975 | Koski | 324/445 |
| 4,559,496 | 12/1985 | Harnden, Jr. et al. | 324/127 |

*Primary Examiner*—Reinhard J. Eisenzopf
*Assistant Examiner*—Anthony L. Miele
*Attorney, Agent, or Firm*—R. A. Hays; M. W. Sales; A. W. Karambelas

[57] ABSTRACT

An apparatus for measuring the resistance in a closed loop electrical circuit without breaking or otherwise disturbing the circuit includes a detachable connector for joining the measuring apparatus to a closed circuit. The connector is linked to a circuit that induces, through the detachable connector, an electrical current in the circuit whose resistance is to be measured and then detects and displays the resistance of the tested circuit.

1 Claim, 7 Drawing Sheets

LOOP RESISTANCE TEST APPARATUS

BACKGROUND OF THE INVENTION

1. Field of the Invention

This invention relates to an apparatus for measuring the resistance of a closed electrical circuit without breaking the circuit and without making any Ohmic connection to the circuit.

2. Description of Related Art

Until now, no apparatus has been available for measuring the resistance of a closed electrical loop or circuit without making an Ohmic connection to the circuit. A need has long existed for an apparatus for measuring the resistance of a closed electrical loop or circuit without unfastening, unsoldering or otherwise breaking or disturbing the circuit.

SUMMARY OF THE INVENTION

This invention provides an apparatus for measuring the resistance of a closed loop electrical circuit without breaking or otherwise disturbing the circuit. This apparatus includes detachable means for connecting the apparatus to a closed loop electrical circuit without breaking or otherwise disturbing the circuit; means for inducing, in the circuit whose resistance is to be measured, a small electrical current through the detachable connector means; and means for detecting and displaying the resistance of the tested circuit.

In preferred embodiments, this new apparatus includes detachable connector means for connecting the testing apparatus to a closed electrical circuit whose resistance is to be tested; means for resonating the connector means, thus nulling the inductive resistance of the connector means; means for providing maximum probe circuit resistance with infinite loop resistance, i.e., means linked to the resonating means for compensating for resistive losses in the resonating circuit; and means for nulling voltages arising from coupling losses between the circuit to be tested and the connector means.

BRIEF DESCRIPTION OF THE DRAWINGS

In the accompanying drawings

DESCRIPTION OF THE PREFERRED EMBODIMENTS

Figure 1:
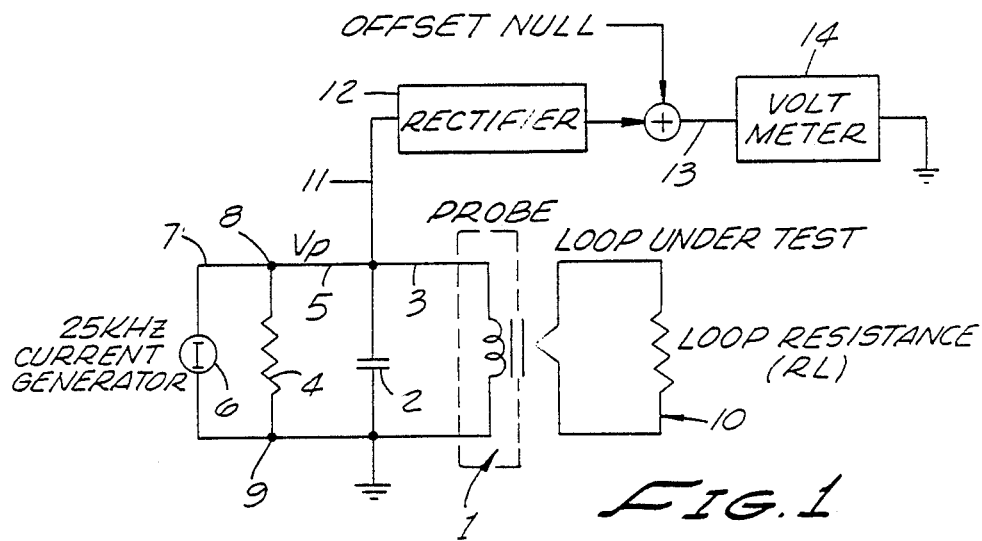
FIG. 1 shows a schematic diagram of a preferred embodiment of the new measuring apparatus.

FIG. 1 shows a preferred embodiment of the apparatus for measuring the resistance of a closed electrical loop circuit that includes detachable connector 1 linked in parallel to resonating capacitor 2 via path 3. Linked in parallel to resonating capacitor 2 is negative resistor 4 via path 5. Current generator 6 is linked in parallel to negative resistor 4 and resonating capacitor 2 through path 7 and connections 8 and 9. This apparatus, when detachably linked to a circuit (such as loop circuit 10) for purposes of measuring its resistance, produces a voltage signal on path 11 that is directly proportional to the resistance of circuit 10. The signal on path 11 passes through rectifier 12 and path 13 to voltmeter 14, where the measured, detected voltage appears as the measured resistance, in Ohms or other appropriate units, of loop 10.

Figure 2:
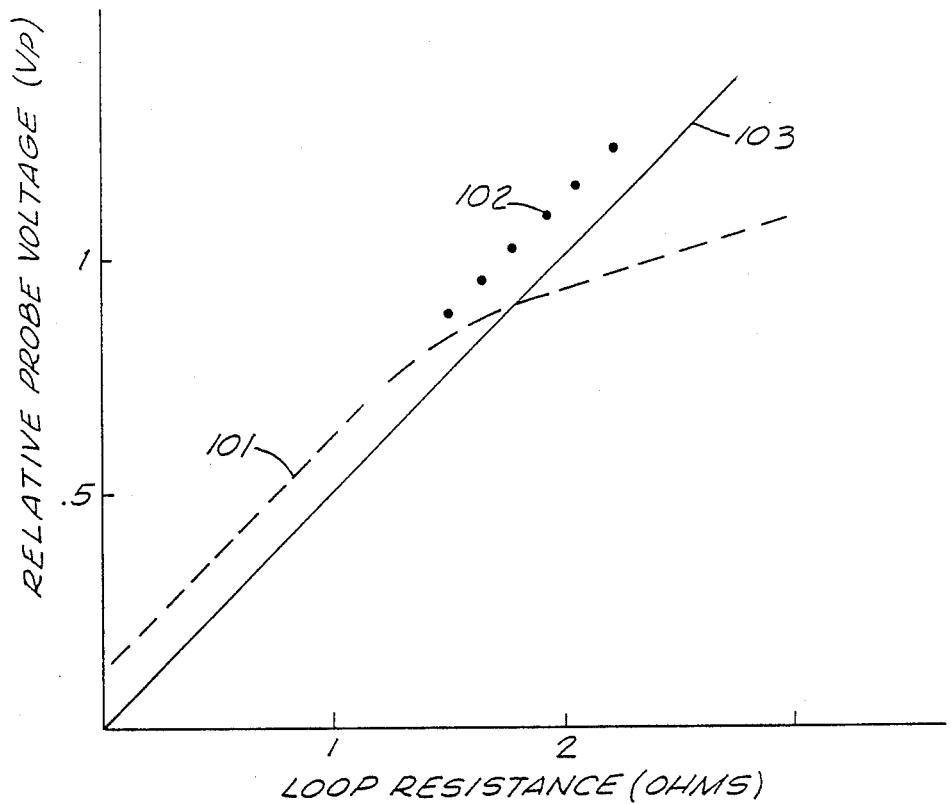
FIG. 2 shows a graph of the relative probe voltage obtained from the preferred embodiment of FIG. 1 against the resistance of the circuit under test, called the loop resistance, in Ohms, and illustrates the effects of certain compensating elements in the measuring apparatus to produce a linear measurement signal that is directly proportional to the resistance in the circuit, whose resistance is being tested.

FIG. 2 shows a graph of measured, detected voltage, labeled Vp on the graph, against the resistance of the loop under test. In this graph, curve 101 shows the output signal that would result if negative resistor 4 were absent from the device of FIG. 1. Curve 102 shows the effect on curve 101 of negative resistor 4 in the apparatus of FIG. 1. Curve 103 shows the effect on curve 101 of the offsetting null.

Figure 3A:
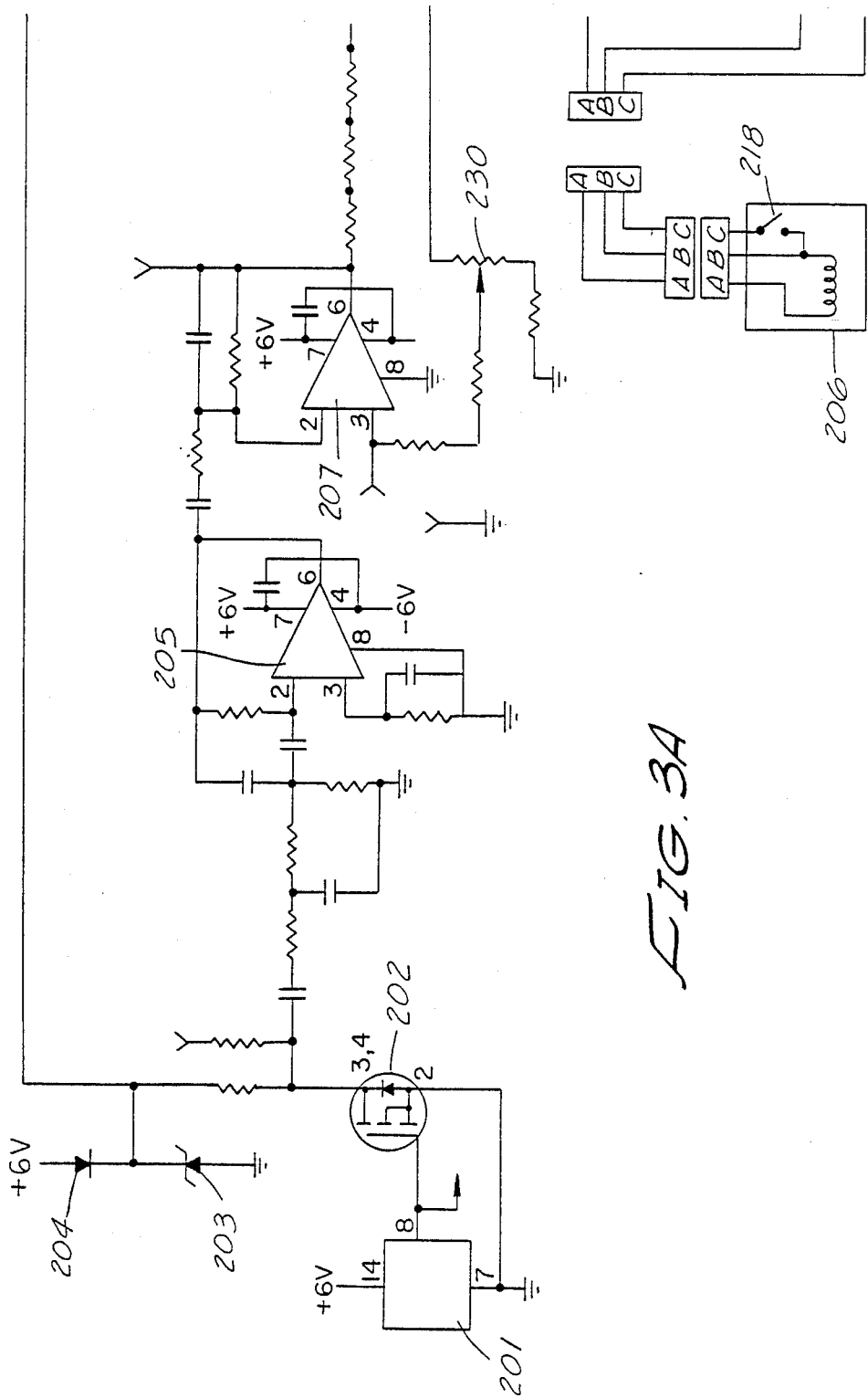
FIGS. 3A and 3B are detailed schematic wiring diagrams of the resistance measurement signal-generating portion of the measuring apparatus depicted generally in FIG. 1.
Figure 3B:
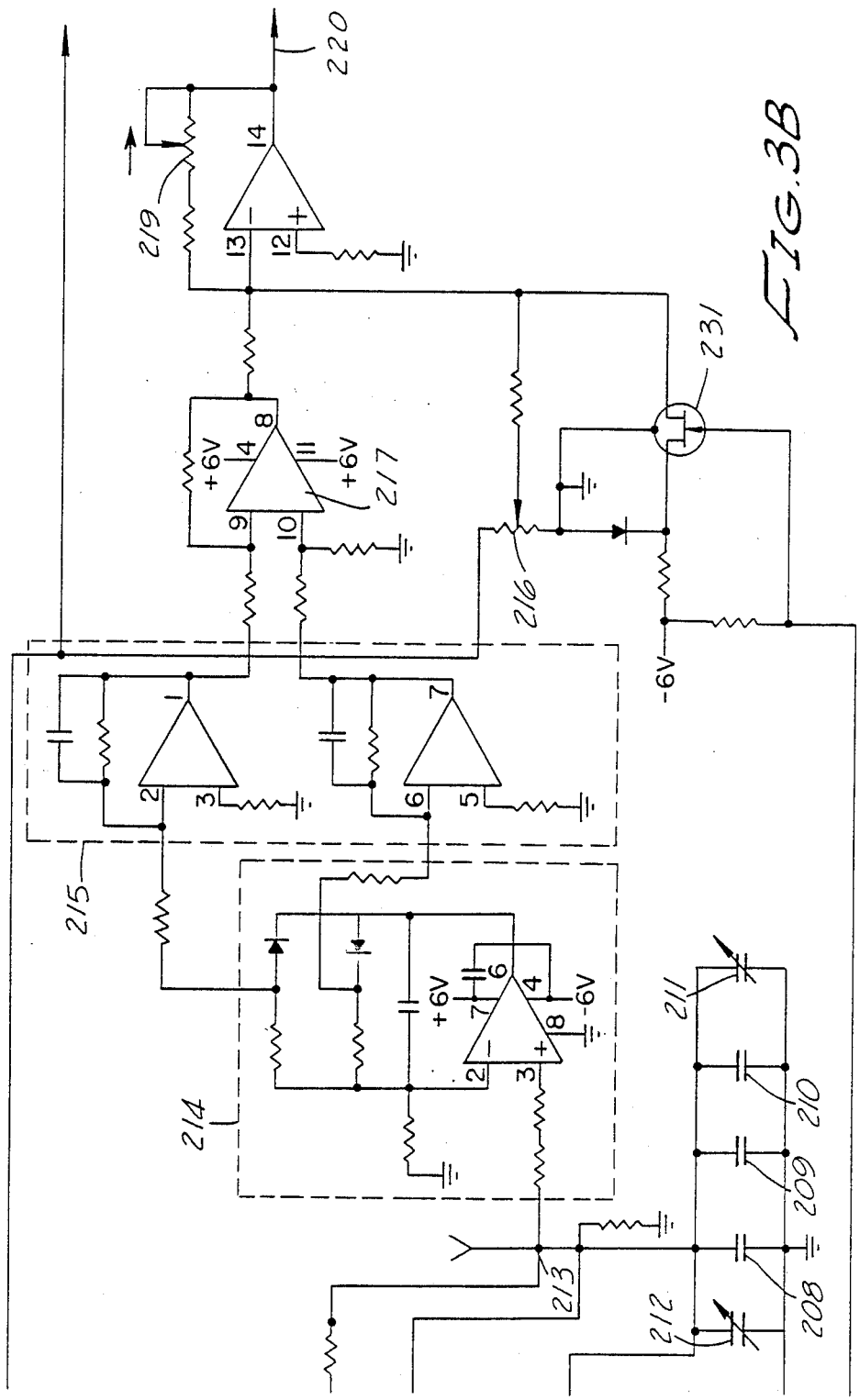

FIG. 3 provides a detailed schematic wiring diagram of the preferred embodiment shown in FIG. 1.

Crystal oscillator 201 generates a square wave electrical signal of, say, 25 kiloHertz. This signal undergoes amplitude regulation in FET 202 and undergoes voltage regulation to a predetermined value, preferably about 2.5 volts, by regulator circuitry 203 and 204. Amplifier 205 converts the square wave signal to a sine wave, and is tuned to substantially the same frequency as signal generator 201.

Probe connector 206, which is preferably a 40-turn split core coil of approximately 2.5 milliHenrys inductance, is connected in series to the output of driver circuit 207, and in parallel across capacitors 208, 209, 210, 211 and 212. These capacitors resonate the circuit that includes connector 206 to a predetermined frequency when connector 206 is in a closed state. The core of connector 206 is split to permit detachable connection to a closed loop circuit whose resistance is to be measured. With the connector detachably linked to the closed circuit whose resistance is to be measured, the resistance of the circuit that includes connector 206 changes in direct proportion to the resistance of the closed loop circuit under test.

Figure 5:
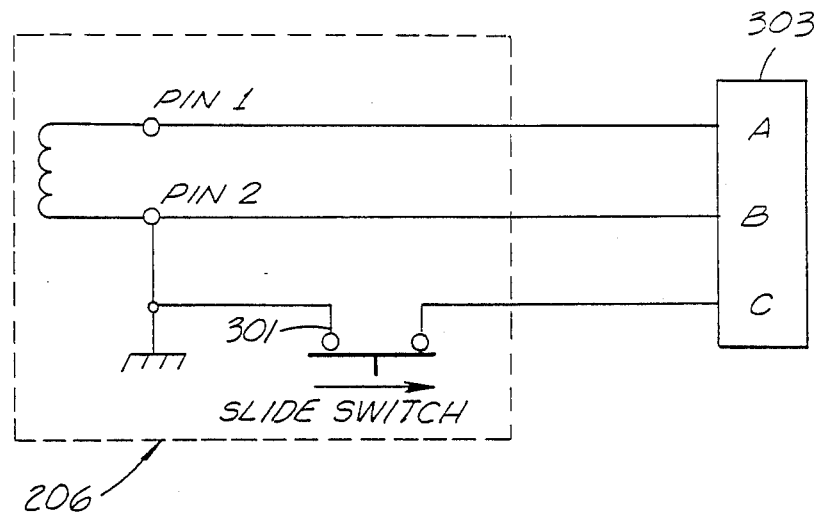
FIG. 5 is a schematic wiring diagram of a preferred embodiment of the connector probe in the measuring apparatus of FIG. 1.
Figure 6:
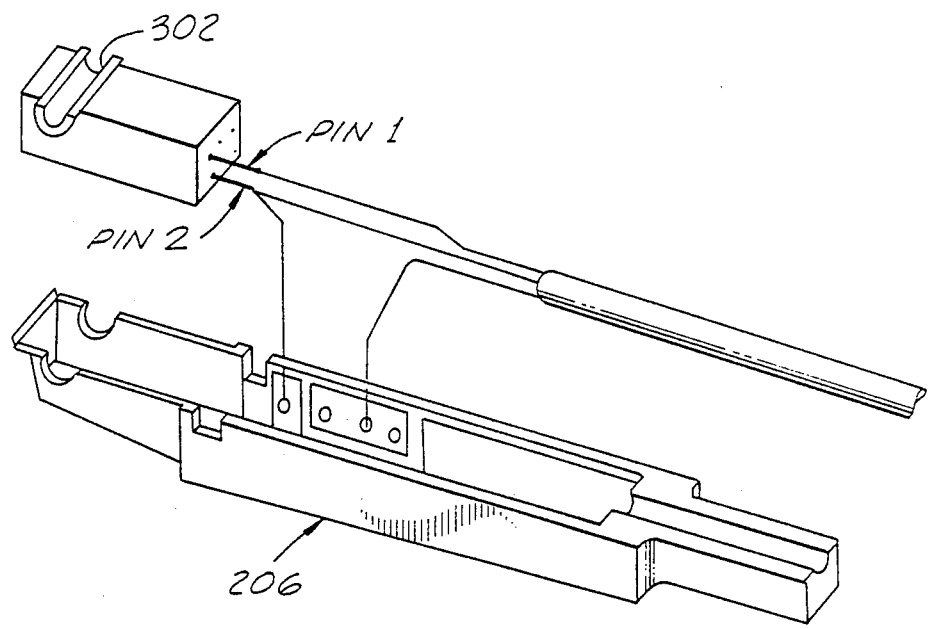
FIG. 6 is an exploded view of the preferred embodiment of the probe used in the measuring apparatus of FIG. 1.

In the preferred embodiment of this apparatus, connector 206 is a clip-on probe made by modifying a Tektronics Model P6021 probe. FIG. 5 shows a schematic wiring diagram for the modified probe. FIG. 6 shows a drawing of the physical structure of the modified probe. As FIG. 5 shows, the probe has a slide switch 301, which opens to permit attaching the probe opening 302 (FIG. 6) to, and for closing the probe around a circuit whose resistance is to be tested. The probe is attached to a three-lead cable that has a coupling 303 at the opposite end of the cable from the probe for connecting the cable/probe/connector assembly to the testing apparatus.

To insure that the change in the resistance or voltage in the circuit under test is directly proportional to the change in resistance in the resonating circuit that includes connector 206, the resonating circuit includes a negative resistance whose value is equal to the positive resistance value of connector 206 when the circuit that includes connector 206 is not attached to a circuit to be tested, i.e., when the resistance of this circuit is infinity. In FIG. 3, this negative resistance is adjusted through adjustable resistor 230. The signal from driver 207, which has a negative output resistance, offsets the losses in the testing circuit that includes connector 206, producing a linear measurement signal at node 213. However, this linear measurement signal does not pass through the origin of the graph shown in FIG. 2, i.e., a measured resistance of zero will not produce a zero voltage or zero Ohm measurement. To correct for this offset, FIG. 3 shows the addition to the measurement signal of a small offsetting DC voltage for the signal voltage that appears at node 213 and is rectified in rectifier network 214, 215. The DC offset is adjusted through adjustable resistor 216, summed with the measured signal at amplifier 217.

To prevent an invalid measurement when connector 206 is open, switch 218 closes, causing transistor 231 to conduct, and forcing the measured signal into an overrange measurement.

With connector 206 closed around the circuit whose resistance is to be tested, the apparatus is calibrated through three adjustable resistors. The low scale adjustment is made by resistor 216, which is set with a low value loop resistance that nulls any zero offset arising from coupling losses. Adjustable resistor 219 provides the mid-scale adjustment, and is set with a value of, say, 0.9 Ohm, to provide overall gain control. The third or high scale adjustment is made through adjustable resistor 212, and nulls resistive losses in the circuit that includes connector 206.

Figure 4A:
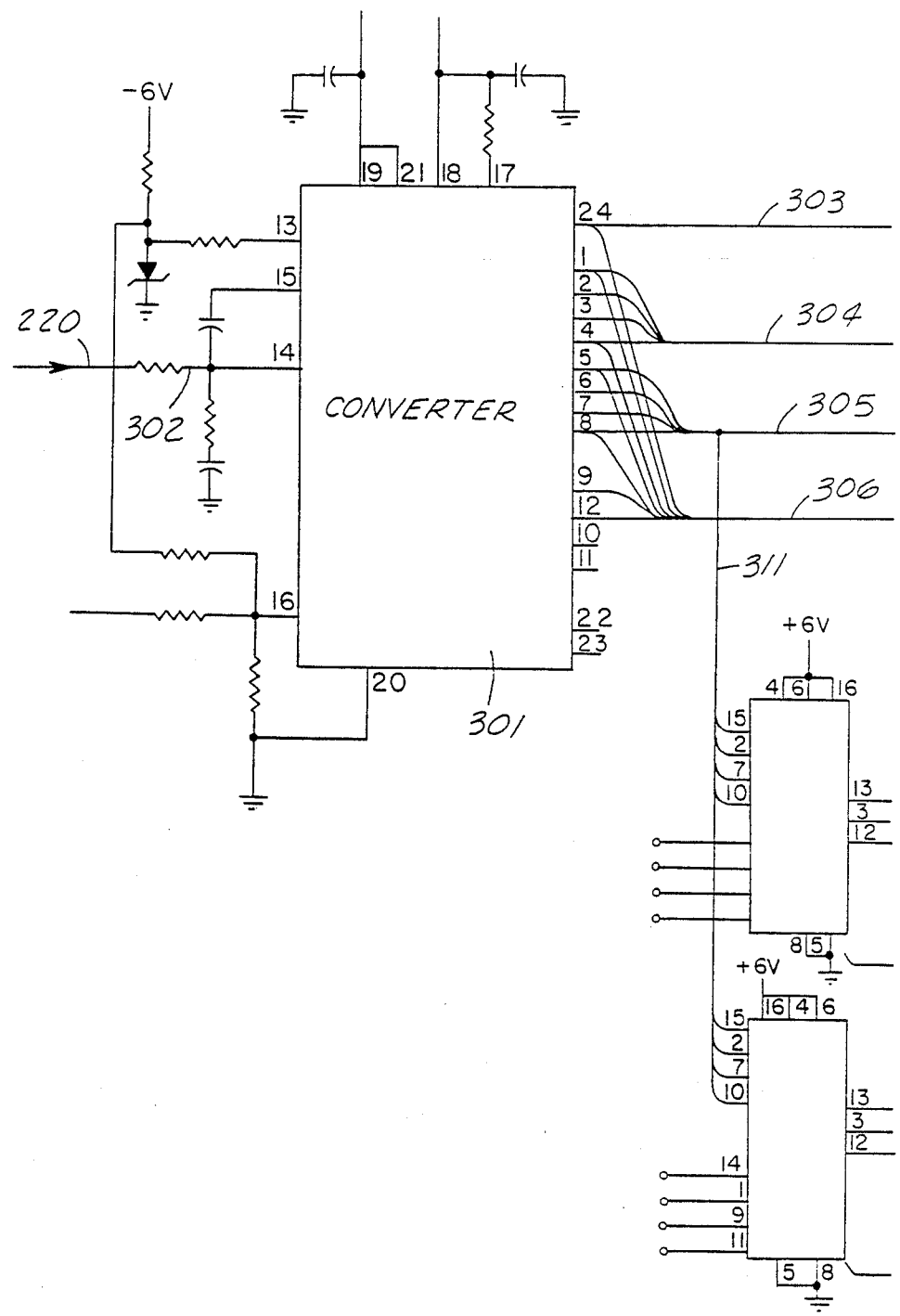
FIG. 4A, 4B and 4C are detailed wiring diagrams of the circuitry for displaying the resistance measurement signals produced by the apparatus of FIG. 3.
Figure 4B:
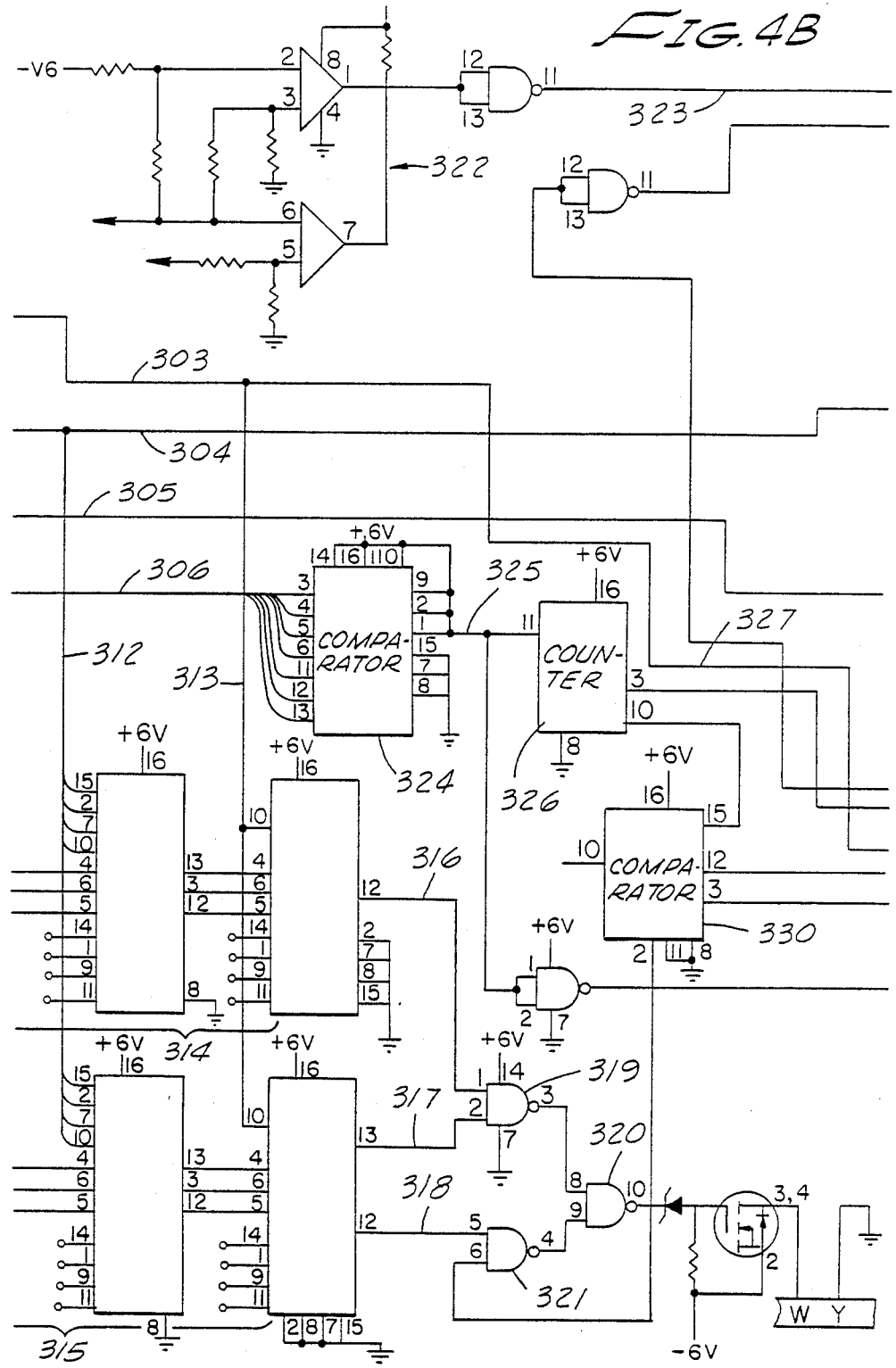
Figure 4C:
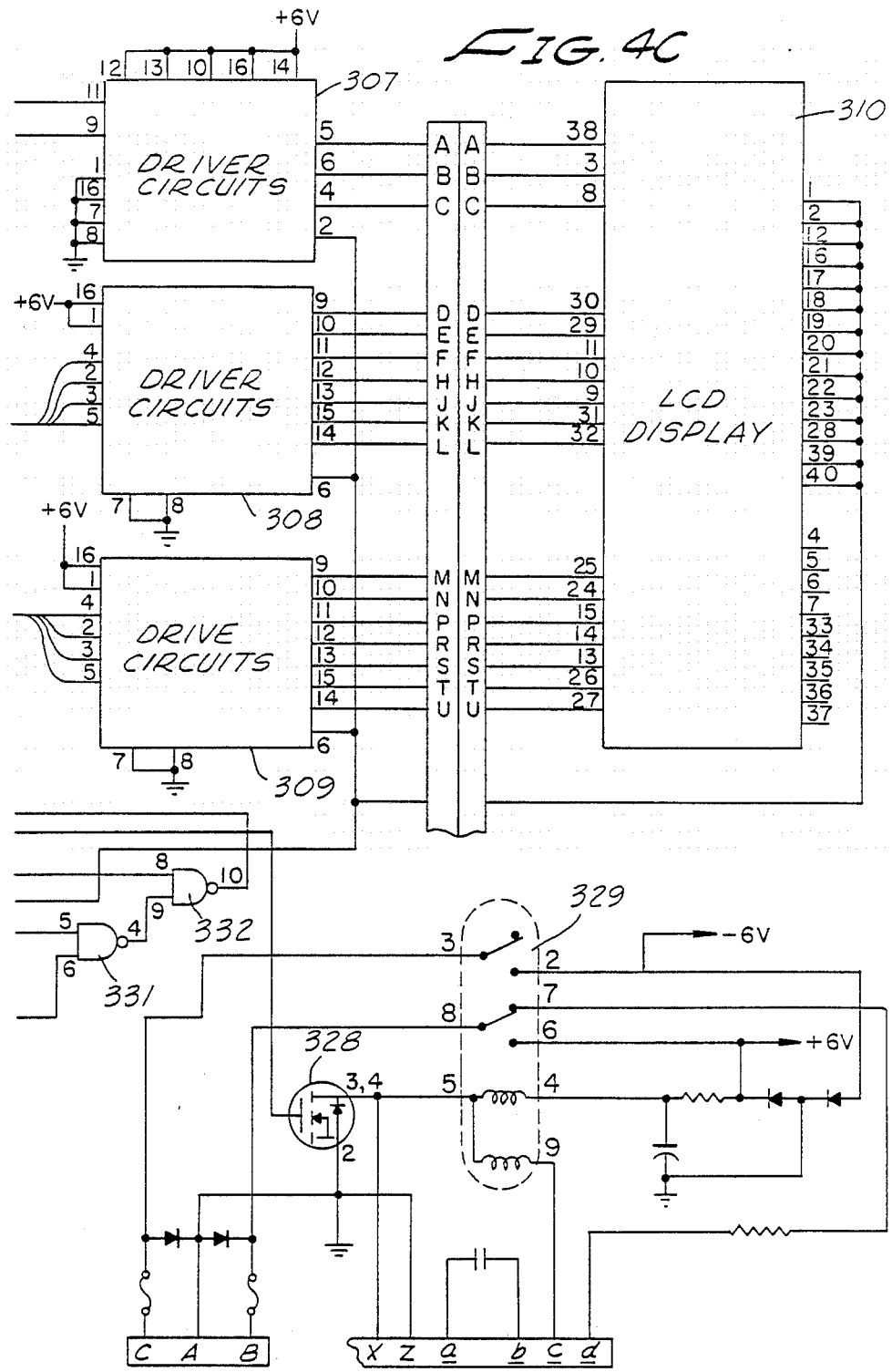

FIG. 4 shows a detailed wiring diagram of the system for displaying the resistance measurement signal appearing on path 220 in FIG. 3. This measurement signal passes to A-to-D convertor 301 on path 302. The resulting digital signal then passes on paths 303, 304 and 305 to LCD driver circuits 307, 308 and 309, which drive LCD display 310 to display the measured resistance of the circuit under test. The signals on paths 303, 304 and 305 also pass on paths 311, 312 and 313 to threshhold detector networks 314 and 315 to produce an audible tone signal of a first type if the measured resistance is in the range of from, say, zero to 0.5 Ohm, an audible tone signal of a second type if the measured resistance is in another range, say, from 0.5 to one Ohm, or no tone signal at all if the measured resistance is above these two ranges. Threshhold detectors do so by generating appropriate signals on paths 316, 317 and 318 to logic devices 319, 320 and 321. These devices generate appropriate signals for producing the desired audible signals.

Comparator network 322 monitors the positive and negative voltages in the batteries that provide power to the measuring apparatus. If either the positive or the negative voltage falls below a predetermined, programmed threshhold value, a low battery indication is displayed on LCD 310 in response to signals passing to LCD display 310 via path 323 and driver 307.

LCD display 310 indicates an overrange voltage when digital-to-analog convertor 301 produces a signal on output path 306 greater than a predetermined value at the threshhold of the overrange condition. In response to such a signal, the output from comparator 324 on path 325 goes low, activating counter 326. After a predetermined length of time, the output of counter 326 goes high (on path 327), turns on FET 328 and pulses latching relay 329 to turn the power off, thus conserving battery power during periods of inactivity.

Comparator 330 provides a clock signal to display drivers 307, 308 and 309, and a slow clock signal when activated through gating circuits 331 and 332, to cause a blinking "one" digit on the LCD display when the output of A-to-D convertor 301 is equal to or greater than the highest resistance the device can measure, say when this output is greater than 1.999 Ohms. In alternative embodiments, the device can be configured to measure resistances over a different, and larger or smaller range of values, as desired.

In the operation of this preferred embodiment, the clip-on probe/cable/connector unit is attached to the front panel of the apparatus, and the slide switch is moved to the closed position. The power for the test apparatus is turned on, activating LCD display 310. If the apparatus is operating normally, LCD display 310 shows a reading of 1.999 with the "1" digit blinking. The calibration of the unit can be checked by attaching the probe to one of the three calibration bars on the front panel of the device. One of the calibration bars in the preferred embodiment is rated 0.1 Ohm; the second, 0.8 Ohm; the third, 1.5 Ohms. With the probe attached to the 0.1 Ohm bar, LCD display 310 should read 0.10 plus or minus 0.01 Ohm. With the probe attached to the 0.8 Ohm calibration bar, LCD display 310 should read 0.80 plus or minus 0.04 Ohm. With the probe attached to the 1.50 Ohms bar, the display should read 1.50 Ohms plus or minus 0.20 Ohm. If the error is greater than 0.20 Ohm, adjustable capacitor 211 is adjusted until the display reading peaks.

To calibrate the apparatus, connector 206 is attached to a 0.1 Ohm calibration loop, and potentiometer 216 is adjusted until LCD display 310 reads 0.10 Ohm plus or minus 0.01 Ohm. Then, with connector 206 connected to a 0.9 Ohm calibration loop, potentiometer 219 is adjusted until LCD display 310 reads 0.90 Ohm. Finally, with connector 206 linked to a 1.9 Ohm calibration loop, potentiometer 230 is adjusted until LCD display 310 reads 1.90 Ohms. The calibration steps are repeated, as necessary, to attain proper LCD readings at all three calibration levels. Finally, with connector 206 attached to a 1.9 Ohm calibration loop, the voltage at the output of driver 207 is measured, and should be 6.8 volts plus or minus one volt, peak-to-peak.

What is claimed is:

1. An apparatus for measuring the resistance of a closed circuit without breaking said circuit comprising:
   detachable means for connecting said apparatus to said circuit without breaking said circuit;
   means for inducing, in the circuit whose resistance is to be measured, an electrical current through said detachable connector means;
   means for resonating said connector means;
   means for providing maximum connector circuit resistance when said loop resistance is infinite;
   means linked to said resonating means for nulling voltages arising from coupling losses between the connector means and said closed loop circuits; and
   means for detecting and displaying the resistance of said tested circuit.

* * * * *